US010454162B2

(12) United States Patent
Proshold et al.

(10) Patent No.: US 10,454,162 B2
(45) **Date of Patent: *Oct. 22, 2019**

(54) APPARATUS AND METHOD TO REDUCE WIND LOAD EFFECTS ON BASE STATION ANTENNAS

(71) Applicant: Quintel Technology Limited, Bristol (GB)

(72) Inventors: Byron Dean Proshold, Spencerport, NY (US); Ching-Shun Yang, Irvine, CA (US); Peter Chun Teck Song, San Francisco, CA (US); David Edwin Barker, Stockport (GB)

(73) Assignee: Quintel Cayman Limited, Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 15/983,708

(22) Filed: May 18, 2018

(65) Prior Publication Data

US 2018/0287251 A1 Oct. 4, 2018

Related U.S. Application Data

(63) Continuation of application No. 15/050,312, filed on Feb. 22, 2016, now Pat. No. 9,979,079.

(Continued)

(51) Int. Cl.

| | |
|---|---|
| ***H01Q 1/42*** | (2006.01) |
| ***H01Q 1/00*** | (2006.01) |
| *F15D 1/10* | (2006.01) |

(52) U.S. Cl.

CPC ............... *H01Q 1/42* (2013.01); *H01Q 1/005* (2013.01); *F15D 1/10* (2013.01); *H05K 999/99* (2013.01)

(58) Field of Classification Search

CPC .......... H01Q 1/42; H01Q 1/421; H01Q 1/422; H01Q 1/424; H01Q 1/425; H01Q 1/247; H01Q 1/428

See application file for complete search history.

(56) References Cited

U.S. PATENT DOCUMENTS

| | | | | |
|---|---|---|---|---|
| 4,930,729 A | | 6/1990 | Savill | |
| 5,379,557 A | * | 1/1995 | Kotter | E01F 8/0023 52/591.2 |

(Continued)

FOREIGN PATENT DOCUMENTS

| | | |
|---|---|---|
| DE | 20 2009 001821 U1 | 4/2009 |
| WO | WO 2007/066199 A2 | 6/2007 |

OTHER PUBLICATIONS

PCT Search Report Application No. PCT/US2016/018979, dated May 5, 2016, pp. 1-12.

(Continued)

*Primary Examiner* — Daniel Munoz

(74) *Attorney, Agent, or Firm* — Tong, Rea, Bently & Kim, LLC

(57) ABSTRACT

In one example, an antenna radome may have at least a first face that includes a plurality of surface features, where the plurality of surface features may include at least a first ridge and at least a first depression, and where the plurality of surface features may be oriented longitudinal along the antenna radome. In another example, an antenna radome may have at least a first face that includes a plurality of surface features, where the plurality of surface features may include at least a first ridge and at least a first depression, and where the plurality of surface features may be oriented transverse along the antenna radome.

22 Claims, 14 Drawing Sheets

700

Related U.S. Application Data

(60) Provisional application No. 62/119,702, filed on Feb. 23, 2015.

(56) References Cited

U.S. PATENT DOCUMENTS

| | | | |
|---|---|---|---|
| 5,735,761 | A | 4/1998 | Palmquist |
| 7,460,080 | B1 | 12/2008 | Watson, III |
| 2002/0045502 | A1 | 4/2002 | Ogg |
| 2005/0190116 | A1 | 9/2005 | Syed et al. |
| 2005/0241906 | A1 | 11/2005 | Leon |
| 2009/0224997 | A1 | 9/2009 | Chereson |
| 2011/0063183 | A1 | 3/2011 | Sanford |
| 2012/0188145 | A1 | 7/2012 | Sato et al. |

OTHER PUBLICATIONS

Ilgin, "A Study of Tall Buildings and AeroDynamic Modifications Against Wind Excitation", journal details, 2006, https://etd.lib.metu.edu.tr/upload/12607000/index.pdf> entire document.
Extended Search Report dated Feb. 13, 2018 in corresponding EP Application No. 16756131.5, 9 pages.

* cited by examiner

200

600

700

APPARATUS AND METHOD TO REDUCE WIND LOAD EFFECTS ON BASE STATION ANTENNAS

CROSS-REFERENCE TO RELATED APPLICATIONS

This application is a continuation of U.S. patent application Ser. No. 15/050,312, filed Feb. 22, 2016, which claims priority under 35 U.S.C. § 119(e) to U.S. Provisional Patent Application Ser. No. 62/119,702, filed Feb. 23, 2015, both of which are herein incorporated by reference in their entireties.

FIELD OF THE DISCLOSURE

The present disclosure relates generally to antenna radomes, and more particularly to solutions to minimize wind-loading effects.

BACKGROUND

Wireless communication has grown rapidly into today's multitude of various high speed mobile broadband radio standards. With rapidly diminishing cost of ownership for a mobile handset, subscriber traffic growth has been exponential over recent years, hungry for enhanced real time data services. This prompted network operators, struggling to cope with the surge in data traffic, to increase capacity by deployment of more cellular base station sites, and base station antennas. Each base station site typically consists of a tower or rooftop supporting a number of antennas, to provide mobile communications service coverage across a number of different sectors. In addition, new spectrum bands, new cellular technologies such as Long Term Evolution (LTE) and Multiple Antenna Techniques such as Multiple In, Multiple Out (MIMO) have also emerged to satisfy the growing demand for mobile data. This has however resulted in base station sites needing to support more antennas and each base station antenna unit having to accommodate multiple antenna arrays squeezed into a single antenna unit's radome. This inevitably adds to the weight, and wind force loading of the cellular antenna mount towers and support structures. The wind impinging on the antenna creates both static and dynamic wind loading effect, which increases the loading limits of these towers.

SUMMARY

In one example, an antenna radome may have at least a first face that includes a plurality of surface features, where the plurality of surface features may include at least a first ridge and at least a first depression, and where the plurality of surface features may be oriented longitudinal along the antenna radome.

In another example, an antenna radome may have at least a first face that includes a plurality of surface features, where the plurality of surface features may include at least a first ridge and at least a first depression, and where the plurality of surface features may be oriented transverse along the antenna radome.

BRIEF DESCRIPTION OF THE DRAWINGS

The teaching of the present disclosure can be readily understood by considering the following detailed description in conjunction with the accompanying drawings, in which.

To facilitate understanding, identical reference numerals have been used, where possible, to designate identical elements that are common to the figures.

DETAILED DESCRIPTION

In one example, the present disclosure provides structure for operating in a wind flow across a range of wind speeds. The structure may comprise a number of surface features which are arranged across one or more surfaces of the structure to allow the structure to experience a critical flow over a wider range of wind speeds than a structure with a smooth surface, and where a wind load is also less than where the structure has a smooth surface at a maximum design wind speed.

For example, the present disclosure may provide an antenna radome with dimpled and/or ridged features, rounded corners, and taper angles to improve wind load performance. Conventional radomes are typically rated for a maximum design wind speed, e.g., a highest acceptable wind speed, but may experience a potentially greater load at less than design wind speed, as described in greater detail below. In contrast, the present disclosure provides antenna radomes which exhibit a critical flow region over a wider range of Reynolds numbers, and hence over a wider range of wind speeds. The present disclosure also creates a lower drag coefficient response over the range of relevant Reynolds numbers representing wind speeds up to a maximum design wind speed. Notably, antenna radomes of the present disclosure do not optimise a minima in the drag coefficient as a function of Reynolds number (and hence wind speed), but ensure that over all wind speeds, less overall stress is placed onto a tower structure. Antenna radomes of the present disclosure also ensure that maximum design wind speed means maximum expected wind load.

Figure 1:
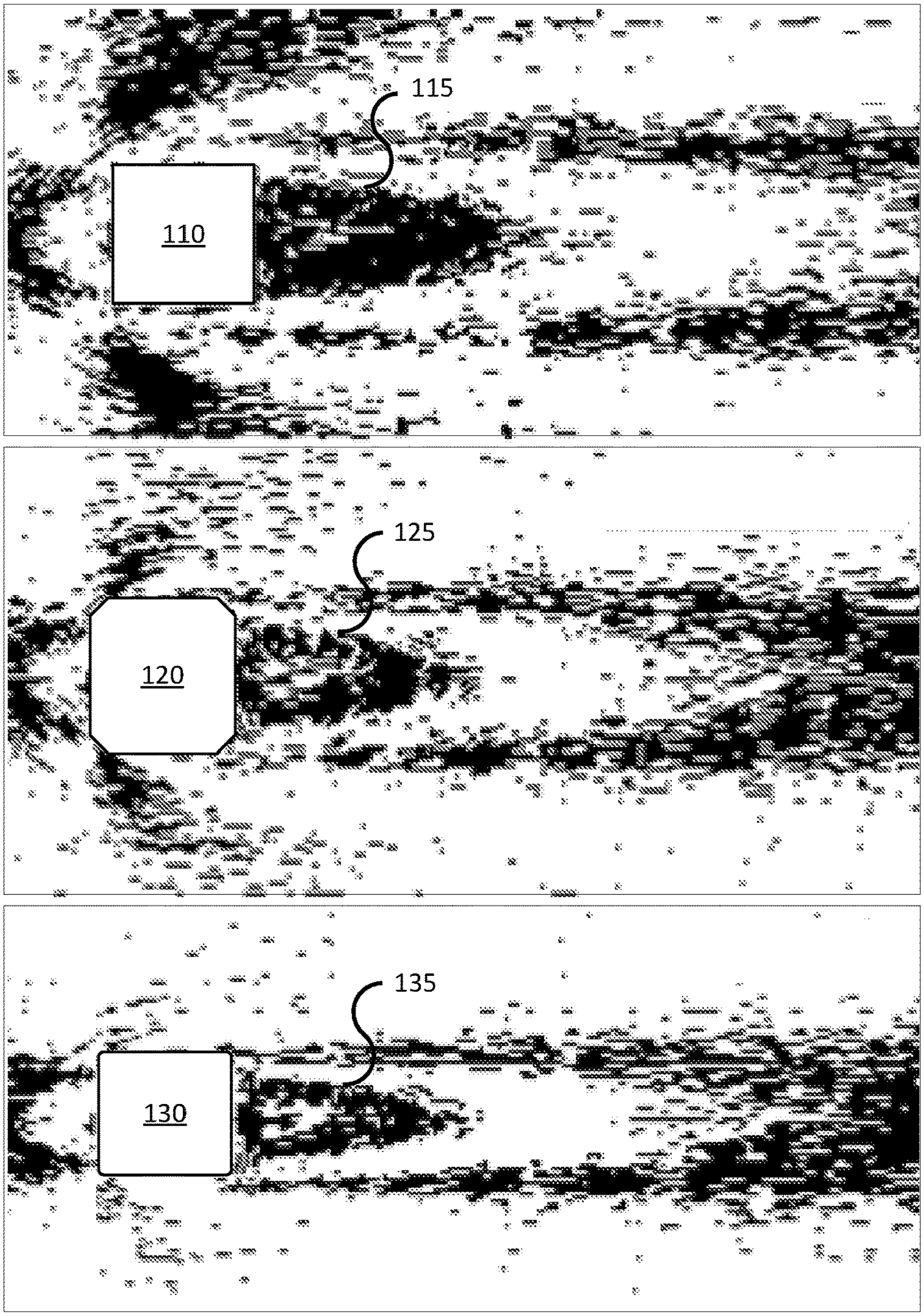
FIG. 1 depicts an example of the velocity comparison of a sharp, chamfered, and rounded corner of a square shaped radome.

Any object, body, or structure though air will produce drag. In addition, edge characteristics around the structure may change the drag coefficient. FIG. 1 shows an example of the velocity comparison of a sharp, chamfered and rounded corner of a square shaped radome under test. It can be seen that the square-shaped radome 110 sharp edges generates the longest and widest wake 115 compared to the square-shaped radome 130 with rounded edges (with wake area 135). This implies that the drag coefficient is much lower in the rounded edges, e.g., by around 33%. The square-shaped radome 120 with chamfered edges generates an intermediate sized wake 125 as compared to the other two examples.

The actual drag of a body or structure is a function of the drag coefficient and the square of the speed at which the structure travels through the medium, or speed at which the medium travels over the structure (in this case, air). In the study of fluid dynamics, the drag coefficient of a body or structure depends upon the Reynolds number. The Reynolds number is dependent upon flow velocity of the medium, kinematic viscosity of the medium, cross-sectional dimensions, and shaping factors (such as rounded edges) of the body. If the body dimensions and kinematic velocity remain unchanged, then the Reynolds number is solely a function of flow velocity.

Figure 2:
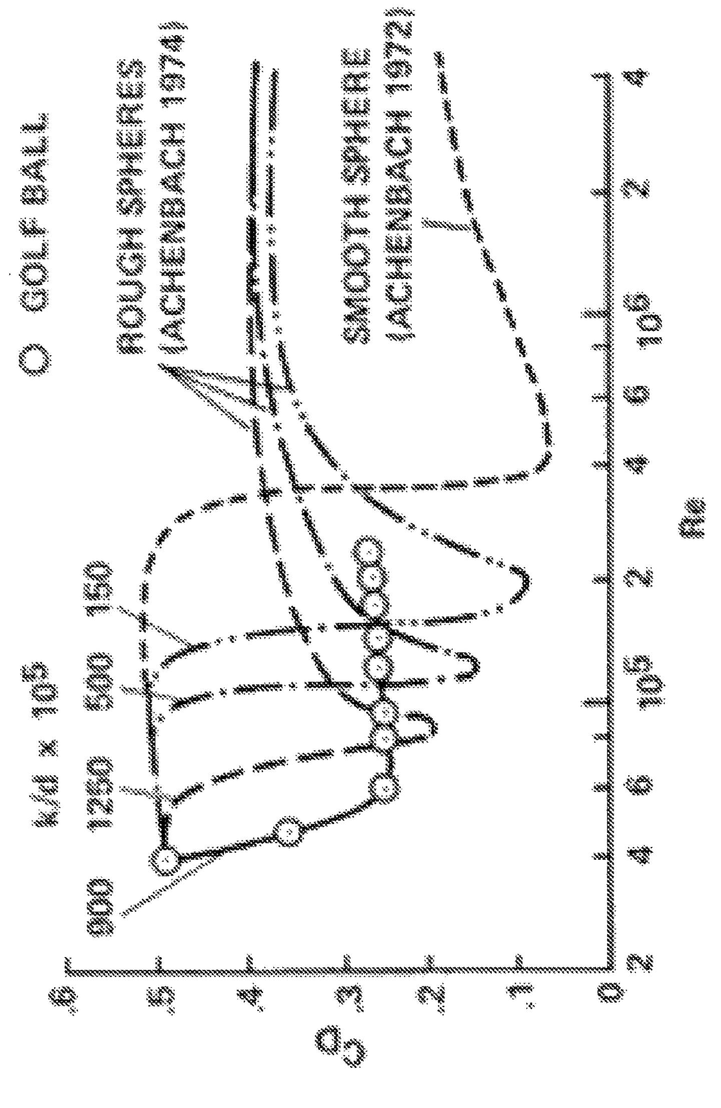
FIG. 2 depicts a chart illustrating how drag coefficient, $C_D$, changes with increasing Reynolds number for several objects.

The chart 200 in FIG. 2 illustrates how the drag coefficient, $C_D$, changes with increasing Reynolds number, Re, and hence increasing speed, for a sphere. There are three distinct flow behavior regions which include: a laminar flow region where flow is not fully separated by the body (at Reynolds numbers less than $2\times10^5$), a critical flow region, and a turbulent region (Reynolds numbers greater than $10^6$). The chart 200 also illustrates how the drag coefficient, $C_D$, changes with increasing Reynolds number, Re, for several rough spheres (with relative roughness, k/d, indicated by the values shown) and for golf balls (e.g., with $k/d\times10^5=900$).

Figure 3:
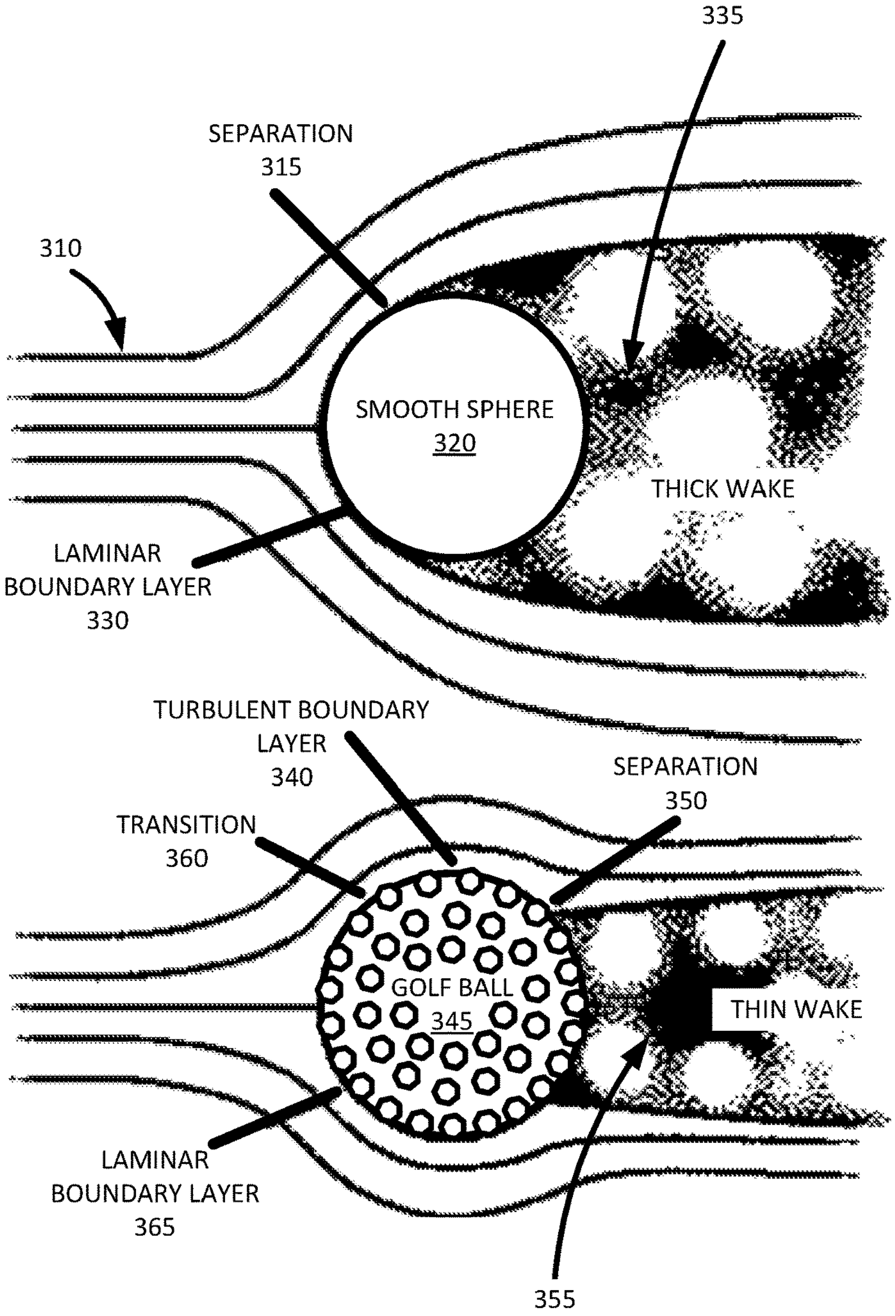
FIG. 3 depicts air flow over a smooth sphere and a dimpled golf ball.

FIG. 3 illustrates air 310 hitting a smooth sphere 320, creating a high pressure area, near laminar boundary layer 330, and with the air flow splitting around the sides of the smooth sphere 320. The air 310, however, is going too fast to continue flowing (i.e., to maintain laminar flow) around to the back of the smooth sphere 320 and begins to separate from the surface at the separation region 315, leaving a low pressure wake 335. The combination of the high pressure difference in front of the sphere and the low pressure on the back creates an overall pressure vector resulting in drag. FIG. 3 also illustrates that a dimpled golf ball 345 results in a thin turbulent layer of air 340 around the golf ball 345 in a transition region 360 that follows the laminar boundary layer 365, enabling the air flow to travel further around the golf ball 345 before separation at the separation region 350. This results in a smaller wake 355, and consequently reduces the drag compared to a smooth spherical ball by up to half. However, the chart 200 in FIG. 2 illustrates that above a certain Reynolds number and hence speed, a smooth sphere produces less drag than a dimpled sphere or a sphere with a roughened surface.

Figure 4:
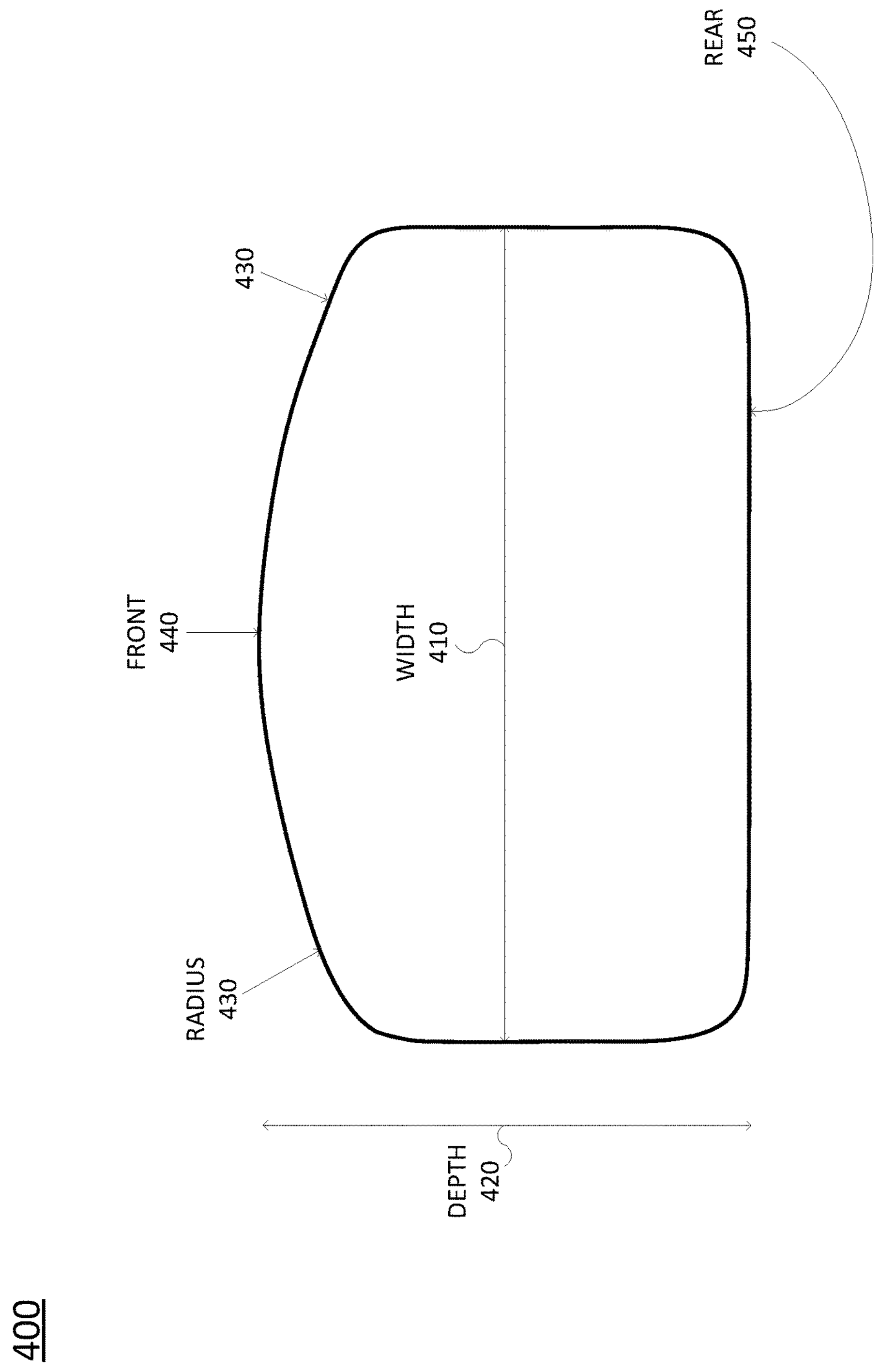
FIG. 4 depicts an example antenna radome cross-section.

A base station antenna typically includes an array of antenna elements arranged along the length of a rectangular reflector; this ensures RF energy is radiated in a forward direction having a narrow vertical (elevation plane) beamwidth. An example cross-section of an antenna radome 400 is illustrated in FIG. 4. The length, width 410, and depth 420 of the antenna radome 400, along with the curved corner radii 430 at the front 440 and back 450 of the antenna radome 400 define its wind load-dependent parameters.

The wind loading for panel antennas is typically quoted against a design wind speed by base station antenna manufacturers; whereupon the loading figure is used by structural engineers to ensure safety critical aspects and structural integrity can be maintained. Many base station panel antenna radomes are between 1.4 m and 2.6 m in length, between 0.2 m and 0.4 m in width, and between 0.1 m and 0.3 m in depth, depending upon spectrum bands, number of arrays and azimuthal radiation beamwidth characteristics. Since base station panel antennas are generally much longer than they are wide or deep, it is the cross-section profile which is most relevant for understanding the drag coefficient. In addition, the frontal wind load is often considered for worst case load calculations, as this presents the largest overall surface area to the wind. However, in some circumstances, wind load may also be calculated for wind arriving at different directions, especially where there may be less of a difference between depth and width. Base station panel antennas of the dimensions quoted above have a Reynolds number around $10^6$ at a design wind speed of approximately 150 km/h (41.7 m/s).

Figure 5:
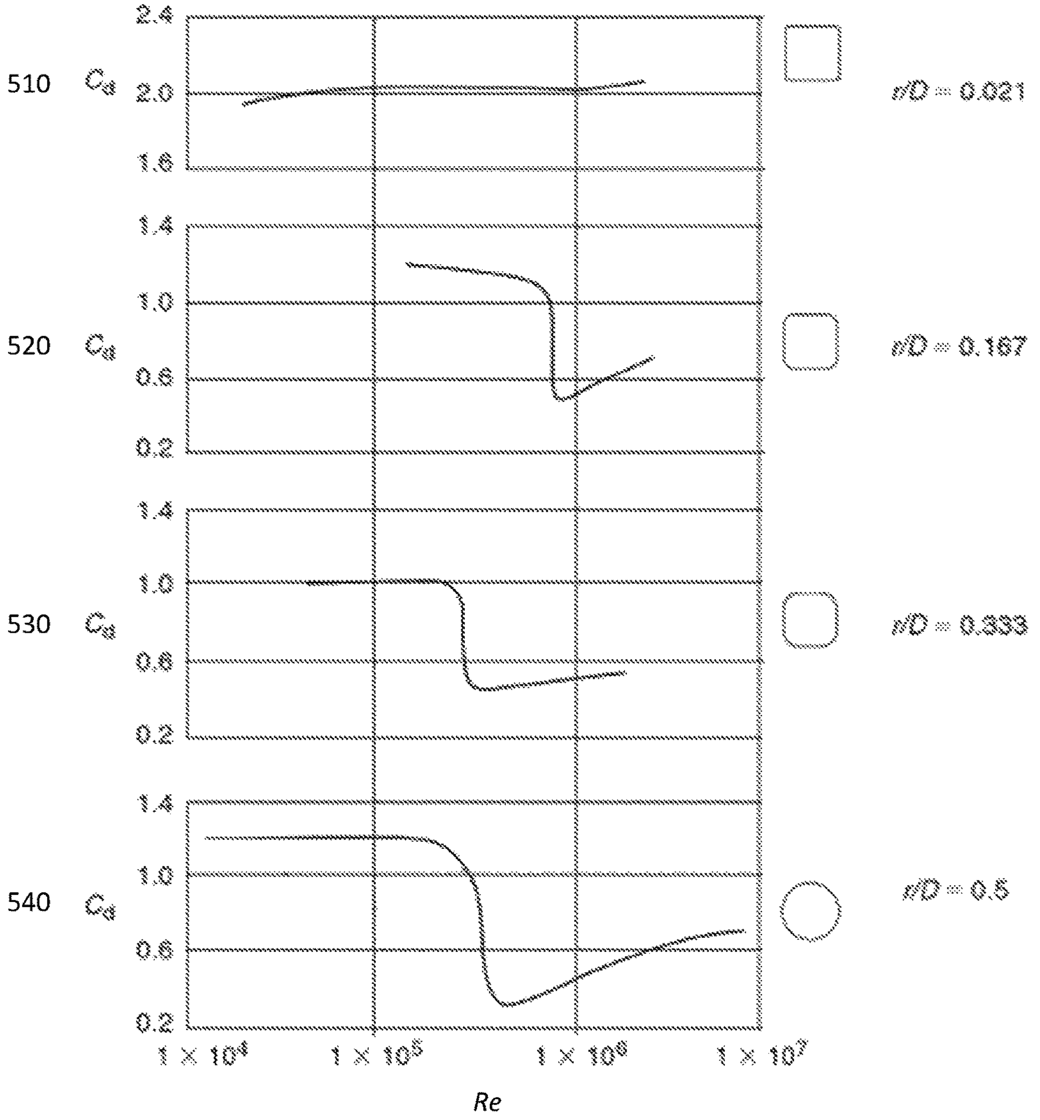
FIG. 5 depicts a composite chart illustrating the effects of the Reynolds number on the drag coefficient with varying corner radii.

FIG. 5 includes a series of graphs 510, 520, 530 and 540 illustrating the effects of the Reynolds number on the drag coefficient with varying corner radii for several rectangular cross-section structures and for a circular cross-section structure (e.g., antenna radomes for panel antennas). It can be seen that the drag coefficient, $C_D$, reduces with increasing edge roundness (r/D). However, as the Reynolds number, Re, increases, there is a transition from laminar flow to turbulent flow around the structure, where drag coefficient drops dramatically. Different edge roundness exhibits different Reynolds numbers at this transition, resulting in very different drag coefficients. A circular/cylindrical structure exhibits a desirable drag coefficient profile through laminar, critical and turbulent flow regions, e.g., as in graph 540; however, the third example of a rectangular structure in graph 530 provides for lower drag coefficients in at least a portion of the turbulent flow region (Reynolds numbers greater than $10^6$). In addition, a cylindrical structure may not always be practical for an antenna radome, since the wind load will increase due to the larger radius needed to encapsulate the antenna elements which stand out from reflector.

FIG. 5 illustrates that it is possible to engineer a minimal wind load for a design wind speed, by ensuring the antenna (or any structure/body) just enters the turbulent flow region at the design wind speed. Taking the second example from FIG. 5, graph 520, which represents the corner radius/width (r/D) ratio of 0.167, it is possible to choose the antenna radome cross-section width dimension such that it has a Reynolds number of just under $10^6$ at design wind speed, with a drag coefficient of approximately 0.5. This may provide a low wind load value as a datasheet specification parameter, and appear to have a lower wind load than a different antenna design that may be considered for use on a communications tower.

However, for Reynolds numbers just below this operating point (which would be created by a slightly lower wind speed) the antenna would experience laminar flow and have a higher drag coefficient (approximately 1.1 in the graph 520 of FIG. 5). This could in fact result in a higher wind load on the tower that for a greater wind speed. Given that a lower wind speed is more likely than the design wind speed, this would place additional loading stress onto the tower which was not anticipated, since there is an implicit assumption that wind load always increases with wind speed.

Figure 6:
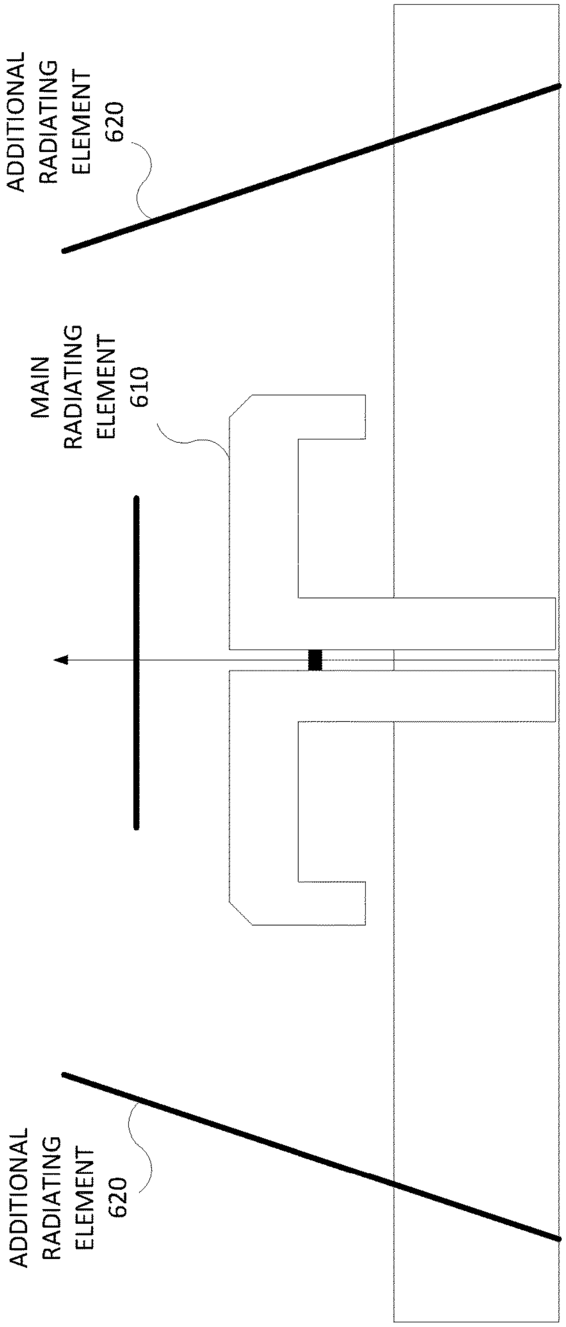
FIG. 6 depicts an example cross-sectional view of an antenna array.

Some antenna array designs make it difficult to utilize antenna radomes with rounded corners beyond a certain corner radius without increasing radome width or depth, which may be undesirable. An example cross-sectional view of such an antenna array 600 is shown in FIG. 6 where the main radiating element 610 is shown in the center but also includes additional radiating components 620 at the edges (used to generate improved azimuth beamwidth radiation patterns), shown slanted in FIG. 6 but which require much of the available antenna depth for their function to be effective. A conformal (rectangular cross-section) radome would allow a minimum volume to be taken in the radome, but with restricted scope for exploiting rounded corners to reduce wind loading.

Figure 7:
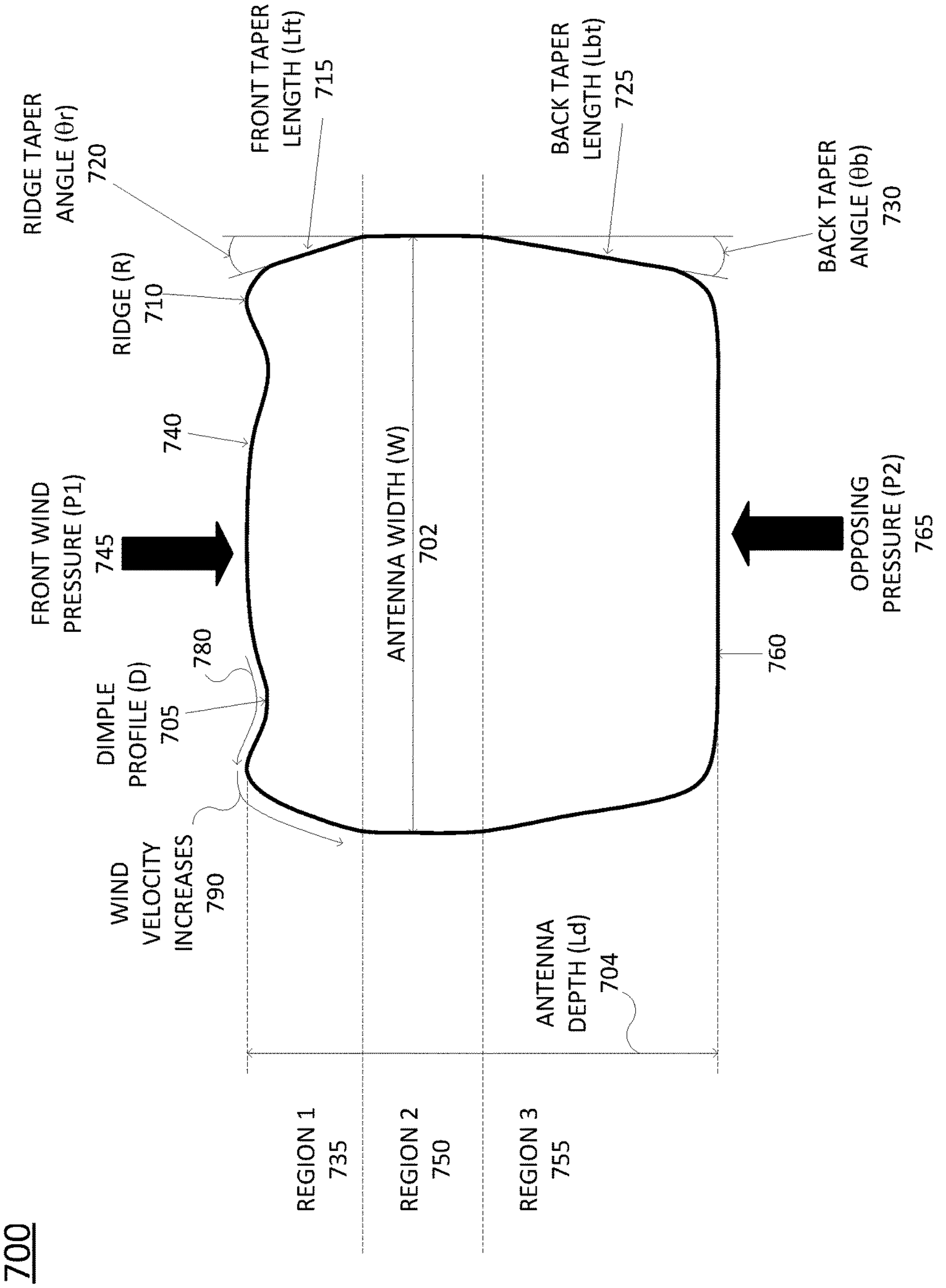
FIG. 7 illustrates an example radome cross-section comprising dimple and ridge features, rounded corners and taper angles.

FIG. 7 illustrates an example of the present disclosure where a cross-section of an antenna radome 700 comprises a rectangular cuboid with dimple/depression and ridge features, rounded corners, and taper angles. As shown in FIG. 7, radome 700 has a width (W) 702 and a depth (Ld) 704. A longitudinal length of radome 700 is orthogonal to the transverse dimensions of the width (W) 702 and a depth (Ld) 704. As also shown in FIG. 7, the radome 700 comprises an elongated dimple, or depression (D) 705, a profile of ridge edge treatment (R) 710, a front taper profile having a length (Lft) 715 and angle (θr) 720, and a back taper profile with length (Lbt) 725 and angle (θb) 730. For ease of illustration, only a single dimple (D) 705, a single ridge edge treatment (R) 710, and so forth are labelled in the Figure. However, it should be understood that opposite sides of the radome 700 may include similar features, as the example of FIG. 7 is symmetrical. In Region 1 (indicated by label 735), as shown in FIG. 7, wind blowing towards the front 740 (also referred to as a front face, or windward face) of the radome 700 generates a frontal wind load pressure (P1) 745. Notably, the front 740 is the face that is most opposite to a mounting structure, e.g., an antenna mast which is secured to the back 760. The air then flows (indicated by arrow 780) into the elongated dimple profile (D) 705 along the length of the radome 700 where micro turbulent effect is created. The air then forces up the ridge profile (R) 710, and exits to the side of the radome 700 with higher velocity (indicated by arrow 790). This effect ensures air flow does not break and separate at the corners of the radome 700 and cause a wide wake. Instead, the accelerated air is guided along the side of the radome 700 in Region 2 (indicated by label 750), preventing early flow separation. The air flowing along the side of the radome 700 then enters Region 3 (indicated by label 755) where the back 760 of the radome 700 is tapered via an angle (θb) 730 to improve flow separation and hence reducing wake and drag. An opposing wind load pressure (P2) 765 is also illustrated at the back 760 of the radome 700.

The result of this combination is to create an antenna radome with a critical flow region over a wider range of Reynolds numbers, and hence over a wider range of wind speeds. In other words, a lower drag coefficient response is exhibited over the range of relevant Reynolds numbers representing wind speeds up to a maximum design speed. In addition, the radome 700 of FIG. 7 would not create a higher load at the maximum design wind speed than for an otherwise smooth surface radome. Notably, the radome 700 of FIG. 7 is not optimised for a minima in the drag coefficient as a function of Reynolds number (and hence wind speed). Instead, the radome 700 of FIG. 7 ensures that over all wind speeds, less overall stress is placed onto a tower structure, and that maximum design wind speed results in the maximum expected wind load.

The antenna radome 700 and aspects thereof may have various dimensions in different embodiments. However, for illustrative purposes, it is noted that in one example, the radome 700 may have a width to depth ratio of approximately 6:5. In various examples, the width (W) 702 may vary from approximately 200 mm to 500 mm. For instance, in one example the width (W) 702 may be approximately 300 millimeters (mm), e.g., 305 mm. In various examples, the depth (Ld) 704 may vary from as little as 50-80 mm or less (e.g., for the current highest frequency cellular standards, when implementing a single band antenna array) up to the size of the width (W) 702. In one example, the depth (Ld) 704 may be approximately 250 mm, e.g., 245 mm. Similarly, the ratio of Region 1 (735) to Region 2 (750) to Region 3 (755) may be approximately 1:1:2. For instance, in one example, Region 1 (735) may be approximately 60 mm, e.g., 65 mm, Region 2 (750) may be approximately 60 mm, e.g., 62 mm, and Region 3 (755) may be approximately 120 mm, e.g., 118 mm. The foregoing is just one example of the dimensions that the radome 700 may take. Thus, it will be appreciated that the width (W) 702 and depth (Ld) 704 of the radome 700, the sizes of the different Regions 1-3 (735, 750, 755), and the relationship between such dimensions may all be varied. The front taper angle (θr) 720 and back taper angle (θb) 730 may also be varied in different examples. For example, the front taper angle (θr) 720 may be varied between 10 and 25 degrees. For instance, the front taper angle (θr) 720 may be 18 degrees. Similarly, the back taper angle (θb) 730 may be varied between 5 and 20 degrees. For instance, the back taper angle (θb) 730 may be 10 degrees.

Figure 8:
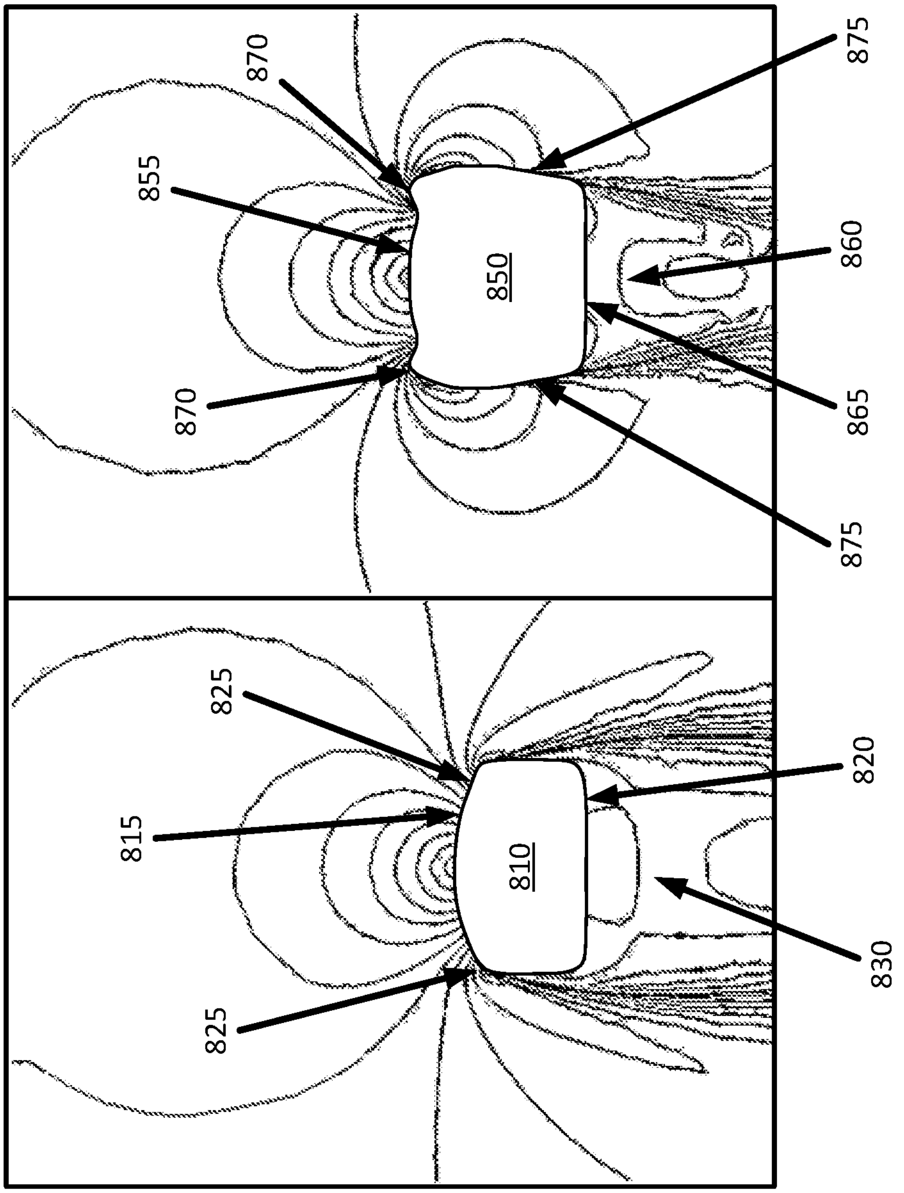
FIG. 8 illustrates the results from a computational fluid dynamics simulation comparing an example radome and a radome of the present disclosure having a cross-section as illustrated in FIG. 7.

FIG. 8 illustrates results from a computational fluid dynamics simulation comparing wind velocity contours of an example radome 810 and a radome 850 of the present disclosure having a cross-section as illustrated in FIG. 7. Radome 810 include a front 815 and a rear 820 (where "front" and "rear" are with respect to a direction of air flow). Flow separation occurs at the front curves as illustrated by reference numerals 825. A wake 830 near the rear 820 of the radome 810 is also shown in FIG. 8. It is evident that for the radome 850, the flow separation occurs further away from the front 855 of the radome 850 (indicated by the arrows 875), resulting in a diminished wake 860, as compared to the wake 830 for radome 810. Comparing the wind velocity profiles, the radome 850 also exhibits a much larger high-wind velocity profile area along the radome corners and sides, e.g., at and near the areas indicated by arrows 870. This means that air is flowing at a much higher speed along the sides of the radome 850 and does not separate until much further towards the back 865 of radome 850 where pressure starts to increase, and wind speed starts to reduce. The taper towards the back 865 of radome 850 also creates a smaller rear surface area to improve on the separation.

Figure 9:
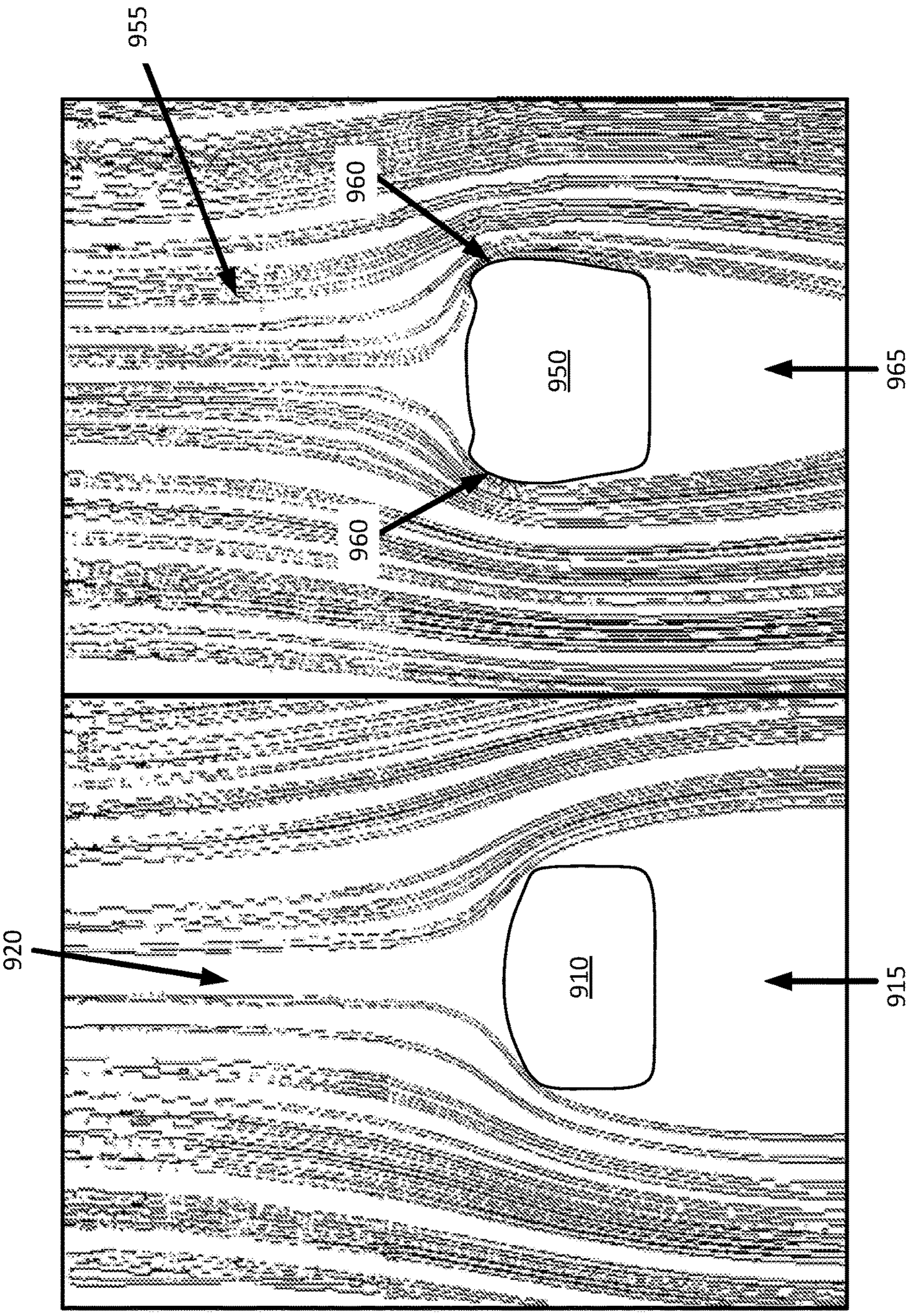
FIG. 9 illustrates air flow past a radome of the present disclosure having a cross-section as illustrated in FIG. 7, as compared to an example radome structure.

FIG. 9 shows the air flow 955 that wraps around the sides of a radome 950 of the present disclosure having a cross-section as illustrated in FIG. 7, instead of punching a large void in the air flow 920 for wake 915 as seen with the example radome structure 910. It can be seen that radome 950 "cuts" into the air more effectively. Due to the higher air velocity in the ridge profile at or near the front corners 960 of radome 950, a Bernoulli effect creates a "lift" towards the opposite vector of the wind flow. In addition, the smaller wake 965 results in a slightly higher pressure at the back of the radome 950. Thus, due to smaller pressure difference between the front and back of the radome 950 (as compared to radome 910), the equivalent force vector (or wind loading factor) is equalised or reduced.

Figure 10:
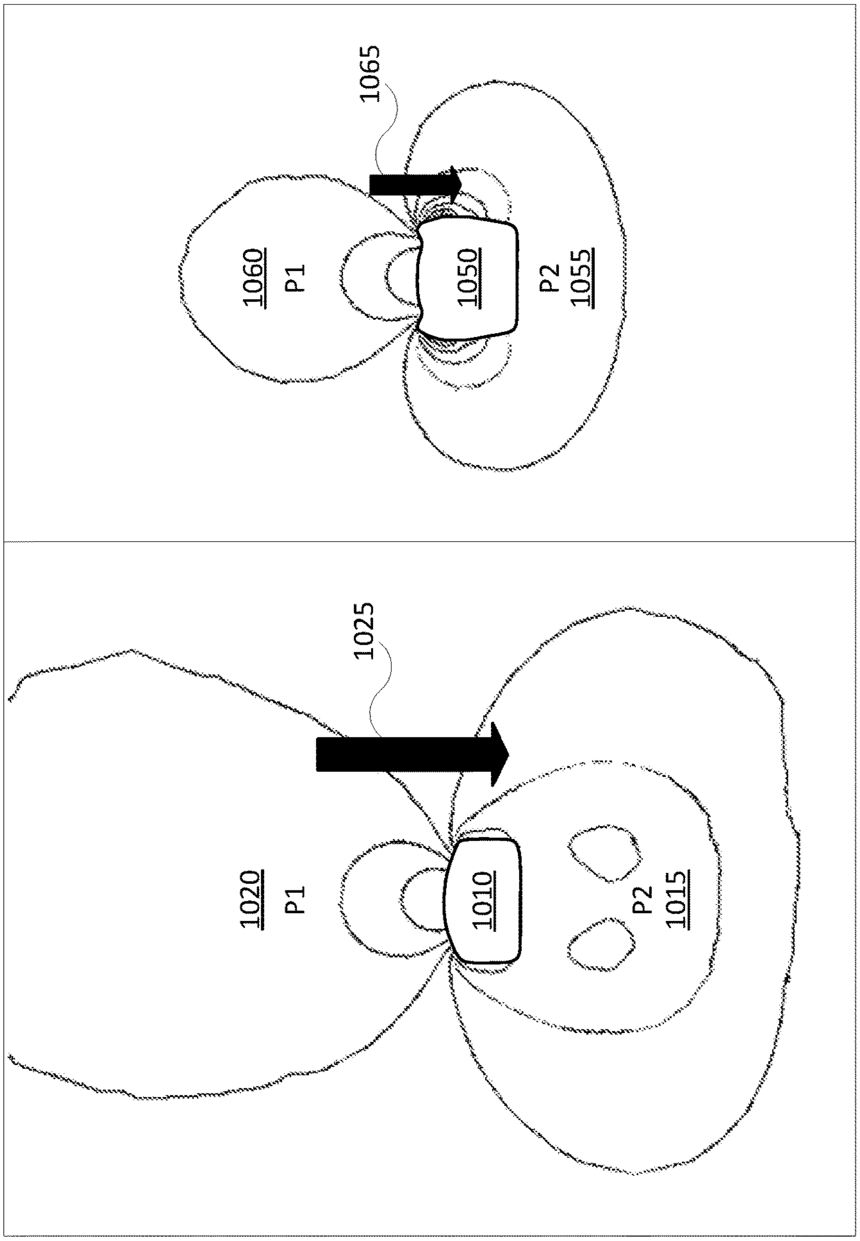
FIG. 10 illustrates pressure contours around an example radome and a radome of the present disclosure with a cross-section as illustrated in FIG. 7.

FIG. 10 illustrates pressure contours around an example radome 1010 and a radome 1050 of the present disclosure with a cross-section as illustrated in FIG. 7. For the radome 1010, a much larger low pressure area 1015 can be seen, causing a larger pressure delta, e.g., indicated by force vector (Fv) 1025, between the high pressure area 1020 in the front and low pressure area 1015 in the back of the antenna radome 1010. This implies that a much higher equivalent force (wind loading factor) is experienced, as compared to radome 1050 where the size of the high pressure area 1060 and the size of the low pressure area 1055 are more evenly matched, resulting in a smaller force vector (Fv) 1065.

Figure 11:
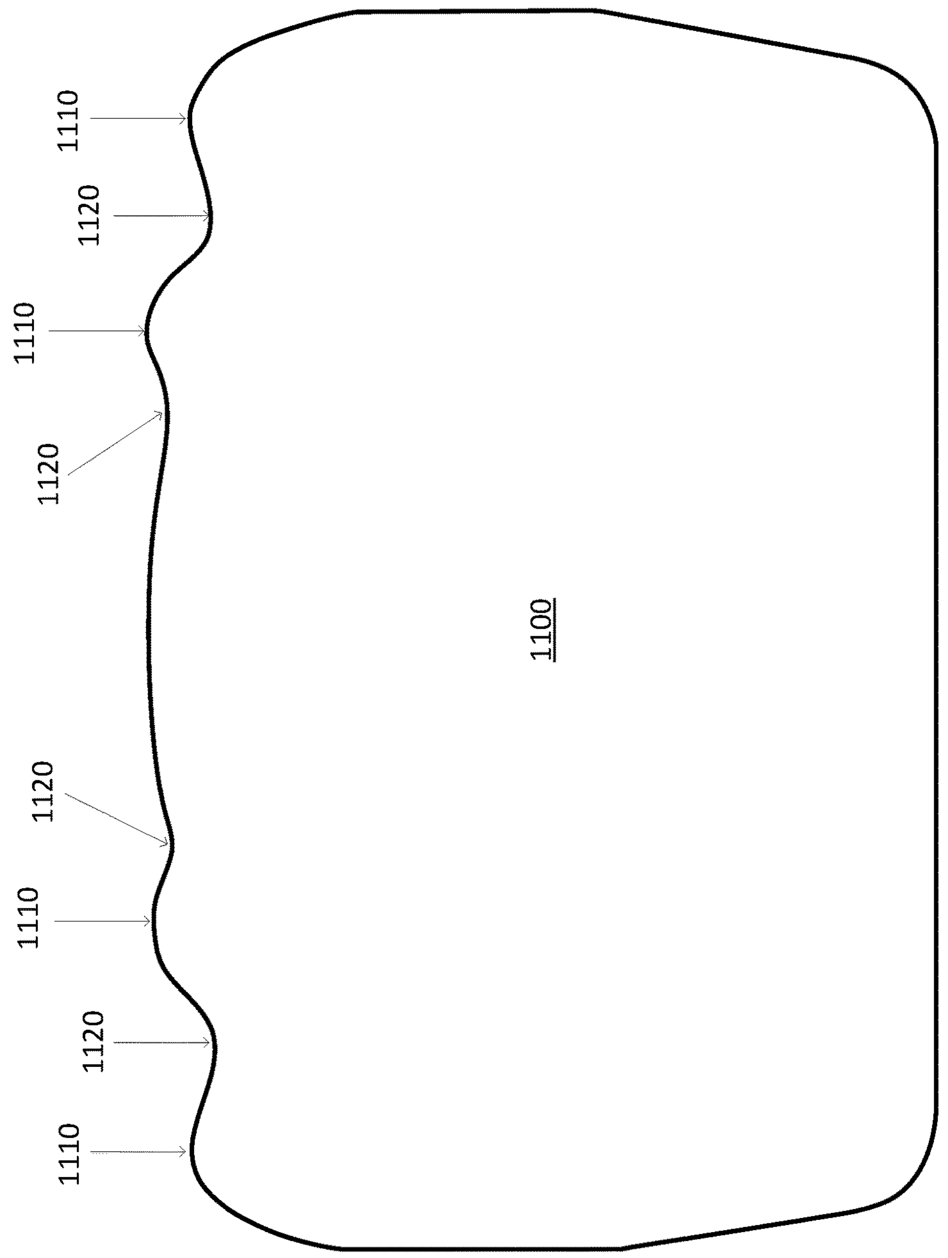
FIG. 11 illustrates a radome cross-section that includes multiple ridges on the front face.

FIG. 11 illustrates another example of the present disclosure where a cross-section of a radome 1100 includes multiple ridges 1110 (and multiple depressions/dimples 1120) on the front face to further reduce wind loading. For instance, the example of FIG. 11 changes where the critical flow region lies. In one example, the radome design of FIG. 11 may be utilized in connection with antenna arrays having larger widths.

Figure 12:
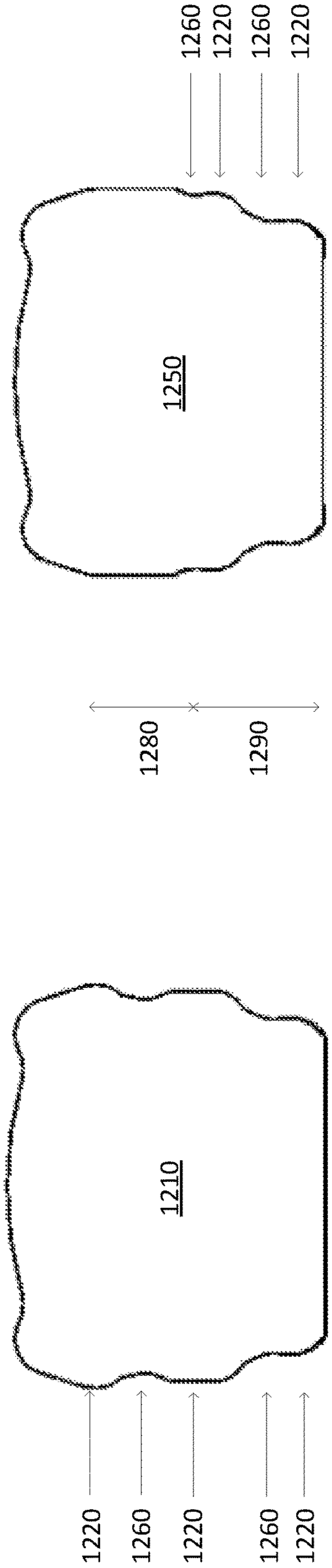
FIG. 12 illustrates radome cross-sections that include ridges along additional regions of the radome.

FIG. 12 illustrates further examples of the present disclosure where cross-sections of radomes 1210 and 1250 include ridges 1220 (and depressions/dimples 1260) along Region 2 (1280) and Region 3 (1290) of the radome to further reduce wake and drag. For instance, the radome designs of FIG. 12 may help to minimize wind-load for wind directions other than perpendicular to the front face of the radome. For example, the designs of FIG. 12 may be useful for radomes which may have similar width and depth, i.e., more square than rectangular cross-section profiles. For ease of illustration, not all of the ridges 1220 and dimples 1260 are specifically labelled.

Figure 13:
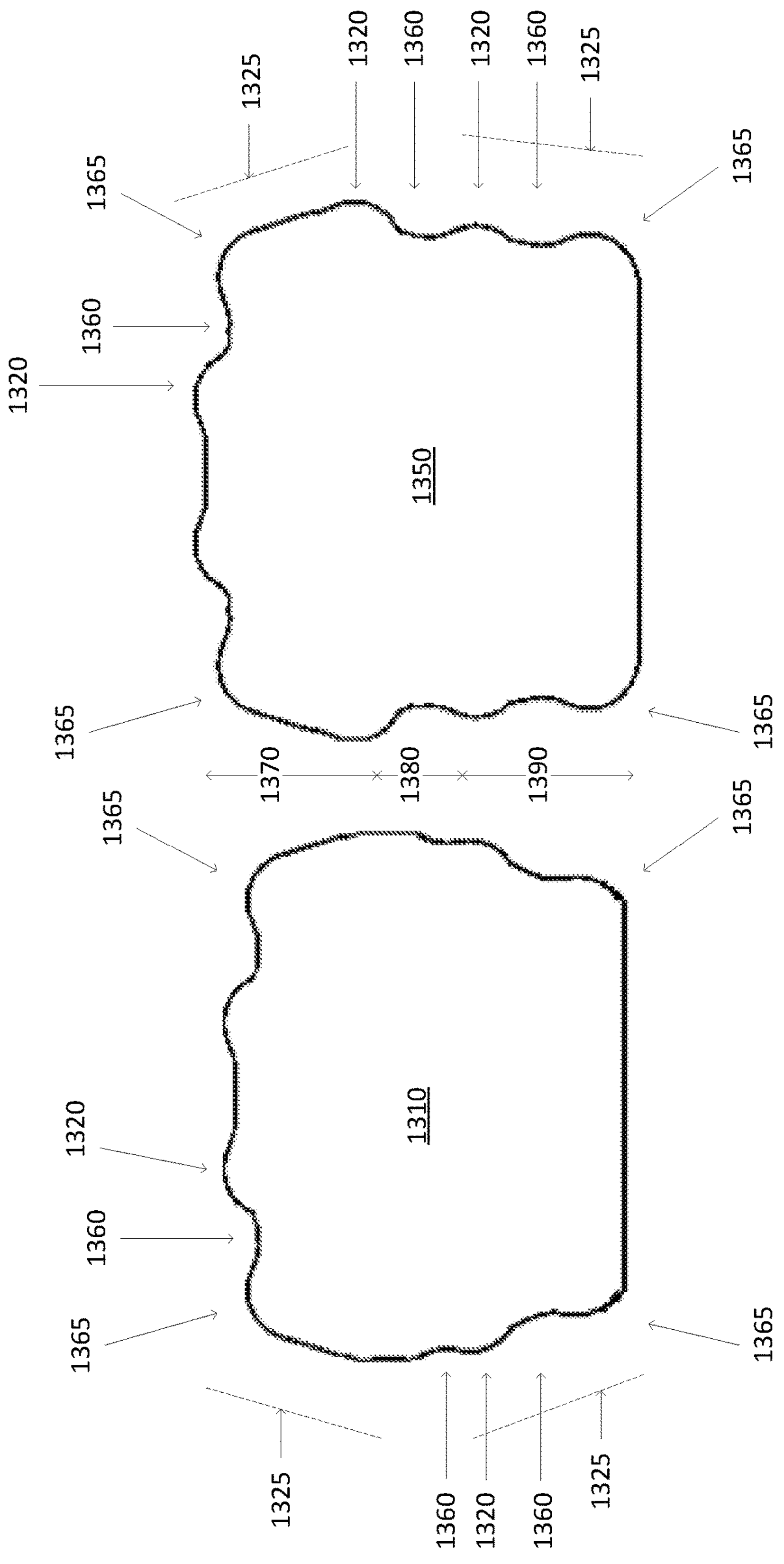
FIG. 13 illustrates radome cross-sections that include multiple features along multiple regions of the radome, according to the present disclosure.

In accordance with the present disclosure the depth, height, number of, locations of, shape of, and the pitch of the ridges and dimples/depressions, the radii of corners, and taper profiles are all design parameters which can be optimized. In this regard, FIG. 13 illustrates examples of the present disclosure where cross-sections of radomes 1310 and 1350 include dimple 1360 and ridge 1320 features along the faces of the radomes, taper angles 1325 in Region 1 (1370) and Region 3 (1390), rounded corners 1365, and ridges 1320 (and dimples 1360) along Region 2 (1380) and Region 3 (1390) of the radomes. In accordance with the present disclosure, any one or more dimples 1360 may have radii, dimple-to-dimple pitch parameters, dimple depth parameters, and dimple shape parameters that are optimized for a minimal wind load over a range of wind speeds. Similarly, any one or more ridges 1320 may have ridge heights, ridge-to-ridge pitch parameters, ridge depth parameters, and ridge shape parameters that are optimized for a minimal wind load over a range of wind speeds. In addition, in various examples of the present disclosure, these various surface features may be oriented longitudinal (e.g., as illustrated in FIGS. 1 and 7-13) or transverse with respect to the length of an antenna radome.

Figure 14:
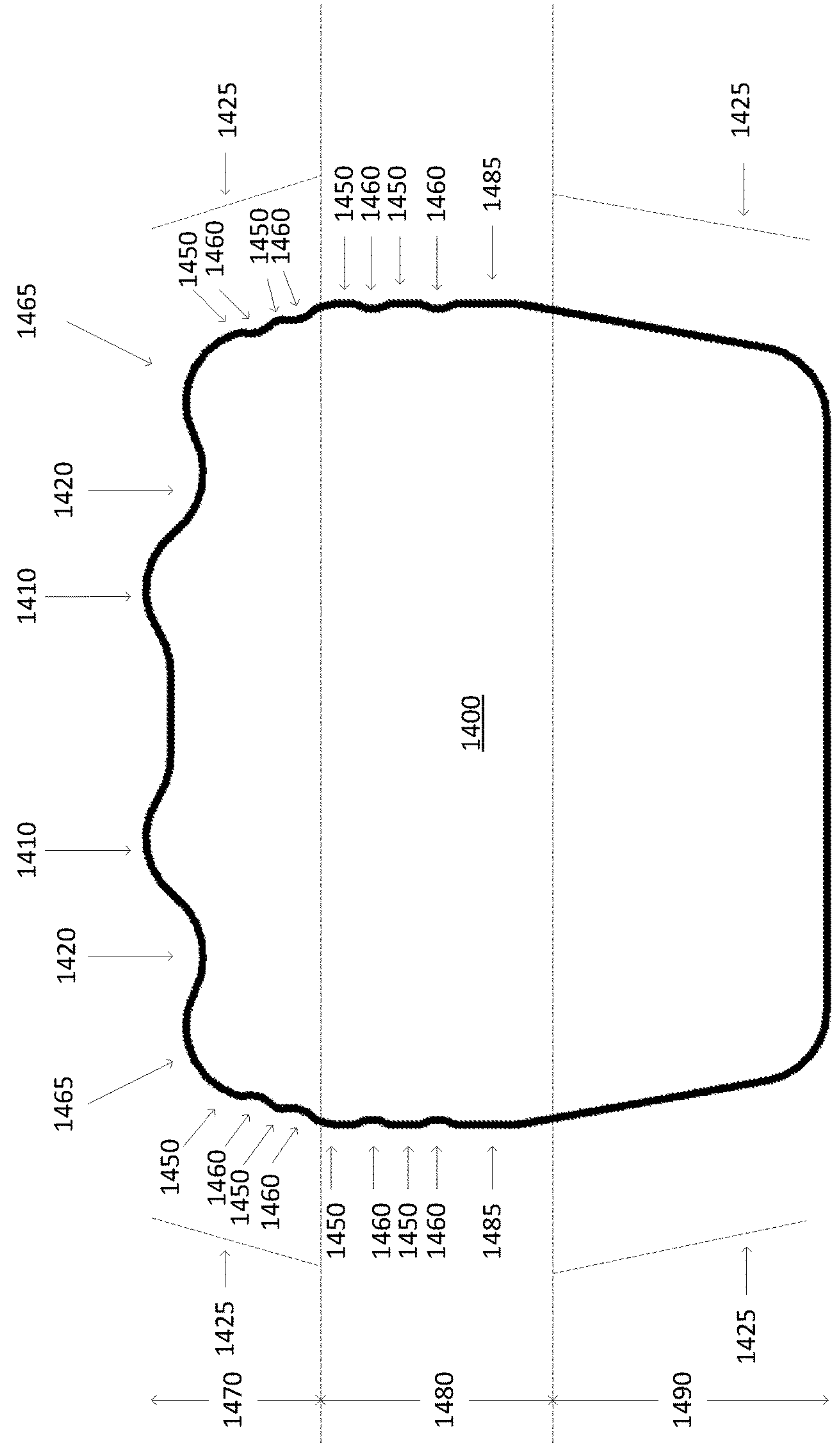
FIG. 14 illustrates a radome cross-section that includes multiple features along multiple faces and multiple regions of the radome, according to the present disclosure.

FIG. 14 illustrates another example of the present disclosure where a cross-section of a radome 1400 includes multiple ridges 1410 (and multiple depressions/dimples 1420) on the front face to reduce wind loading. The example radome 1400 also includes rounded corners 1465 and taper angles 1425 in Region 1 (1470) and Region 3 (1490). The example radome 1400 may also include ridges 1450 (and depressions/dimples 1460) along the side faces in Region 1 (1470) and Region 2 (1480) of the radome 1400 to further reduce wake and drag. For example, the ridges 1450 and depressions/dimples 1460 may comprise smaller features than ridges 1410 and depressions/dimples 1420 on the front face of the radome 1400. To illustrate, a ratio of the radii of the ridges 1410 on the front face to the radii of the ridges 1450 on the sides of the radome 1400 may range from 1:3 to 1:7, for example. For instance, the ratio may be 1:5 in one example.

The effect of the (smaller) ridges 1450 and (smaller) depressions/dimples 1460 on the side faces in Region 1 (1470) and Region 2 (1480) is to create additional turbulence in the boundary layer of air flowing from the front face to the rear face, thereby delaying separation, e.g., pushing the separation region further downstream, and also reducing the wind load over a range of wind speeds. In one example, at least a portion of the ridges 1450 and depressions/dimples 1460 in Region 2 (1480) may be placed at locations where the radome 1400 has a maximum width. In addition, in one example, a straight portion (1485) of the side faces of the radome 1400 may be provided in Region 2 (1480) following the last of the surface features. For instance, the straight portion 1485 may be perpendicular to the front face of the radome 1400 and parallel to a direction of airflow that is normal to the front face. The straight portion 1485 may be ⅛th to ½ of the distance of Region 2 (1480) for example. In one example, the overall dimensions of radome 1400 may be the same or similar to those discussed above in connection with the example radome 700 of FIG. 7.

While the foregoing describes various examples in accordance with one or more aspects of the present disclosure, other and further example(s) in accordance with the one or more aspects of the present disclosure may be devised without departing from the scope thereof, which is determined by the claim(s) that follow and equivalents thereof.

What is claimed is:

1. An antenna radome, comprising:

at least a first face, wherein the at least a first face comprises a plurality of surface features, wherein the plurality of surface features comprise:

at least a first ridge; and at least a first depression, wherein the plurality of surface features are oriented longitudinal along the antenna radome, wherein the antenna radome comprises a rectangular cuboid.

2. The antenna radome of claim 1, wherein the plurality of surface features further comprise:

rounded corner edges.

3. The antenna radome of claim 1, wherein the at least a first depression comprises a dimple.

4. The antenna radome of claim 1, wherein the at least a first depression comprises a plurality of depressions, wherein the plurality of depressions have radii, depression-to-depression pitch parameters, and depth parameters for minimizing a wind load on the antenna radome over a range of wind speeds.

5. An antenna radome comprising:

at least a first face, wherein the at least a first face comprises a plurality of surface features, wherein the plurality of surface features comprise:

at least a first ridge; and at least a first depression, wherein the plurality of surface features are oriented longitudinal along the antenna radome, wherein the antenna radome comprises a plurality of faces, wherein the plurality of faces includes the at least a first face, wherein the at least a first face comprises a windward face for experiencing a greater wind pressure than other faces of the plurality of faces, wherein the windward face has a larger surface area than the other faces or is oriented away from a mounting structure for the antenna radome.

6. An antenna radome comprising:

at least a first face, wherein the at least a first face comprises a plurality of surface features, wherein the plurality of surface features comprise:

at least a first ridge; and at least a first depression, wherein the plurality of surface features are oriented longitudinal along the antenna radome, wherein the antenna radome comprises a plurality of faces, wherein the plurality of faces includes the at least a first face, wherein the at least a first face comprises a windward face for experiencing a greater wind pressure than other faces of the plurality of faces, wherein a taper is applied to each of the plurality of faces of the antenna radome that is adjacent to the windward face, to provide a diminished wake of a wind flow over the antenna radome.

7. An antenna radome comprising:

at least a first face, wherein the at least a first face comprises a plurality of surface features, wherein the plurality of surface features comprise:

at least a first ridge; and at least a first depression, wherein the plurality of surface features are oriented longitudinal along the antenna radome, wherein the at least a first ridge comprises a plurality of ridges, wherein the at least a first face comprises a windward face of the antenna radome, wherein the windward face of the antenna radome comprises a pair of longitudinal edges, wherein the at least a first ridge comprises a first ridge and a second ridge, wherein the at least a first depression comprises a first depression and a second depression, wherein the first ridge and the first depression are applied at a first one of the pair of longitudinal edges, and wherein the second ridge and the second depression are applied at a second one of the pair of longitudinal edges.

8. The antenna radome of claim 7, wherein the plurality of ridges run longitudinally along the windward face of the antenna radome.

9. The antenna radome of claim 7, wherein the plurality of ridges have ridge heights, ridge-to-ridge pitch parameters, ridge depth parameters, and ridge shape parameters for minimizing a wind load on the antenna radome over a range of wind speeds.

10. The antenna radome of claim 7, wherein the first ridge and the first depression that are applied at a first one of the pair of longitudinal edges have a taper with a length and an angle relative to a second face of the antenna radome which is adjacent the windward face, and wherein the second ridge and the second depression that are applied at a second one of the pair of longitudinal edges have a taper with a length and an angle relative to a third face of the antenna radome which is adjacent the windward face.

11. The antenna radome of claim 10, wherein the length and the angle of the taper of the first ridge and the first depression that are applied at the first one of the pair of longitudinal edges and the length and the angle of the taper of the second ridge and the second depression that are applied at the second one of the pair of longitudinal edges are design parameters for minimizing a wind load of the antenna radome over a range of wind speeds.

12. The antenna radome of claim 7, where the positions of the first ridge and the second ridge relative to the first longitudinal edge and the second longitudinal edge of the windward face of the antenna radome accelerate a wind flow over the antenna radome.

13. An antenna radome, comprising:

at least a first face, wherein the at least a first face comprises a plurality of surface features, wherein the plurality of surface features comprise:

at least a first ridge; and at least a first depression, wherein the plurality of surface features are oriented transverse along the antenna radome, wherein the antenna radome comprises a rectangular cuboid.

14. The antenna radome of claim 13, wherein the plurality of surface features further comprise:

rounded corner edges.

15. The antenna radome of claim 13, wherein the at least a first depression comprises a dimple.

16. The antenna radome of claim 13, wherein the at least a first depression comprises a plurality of depressions, wherein the plurality of depressions have radii, depression-to-depression pitch parameters, and depth parameters for minimizing a wind load on the antenna radome over a range of wind speeds.

17. An antenna radome comprising:

at least a first face, wherein the at least a first face comprises a plurality of surface features, wherein the plurality of surface features comprise:

at least a first ridge; and at least a first depression, wherein the plurality of surface features are oriented transverse along the antenna radome, wherein the antenna radome comprises a plurality of faces, wherein the plurality of faces includes the at least a first face, wherein the at least a first face comprises a windward face for experiencing a greater wind pressure than other faces of the plurality of faces, wherein the windward face has a larger surface area than the other faces or is oriented away from a mounting structure for the antenna radome.

18. An antenna radome comprising:

at least a first face, wherein the at least a first face comprises a plurality of surface features, wherein the plurality of surface features comprise:

at least a first ridge; and at least a first depression, wherein the plurality of surface features are oriented transverse along the antenna radome, wherein the antenna radome comprises a plurality of faces, wherein the plurality of faces includes the at least a first face, wherein the at least a first face comprises a windward face for experiencing a greater wind pressure than other faces of the plurality of faces, wherein a taper is applied to each of the plurality of faces of the antenna radome that is adjacent to the windward face, to provide a diminished wake of a wind flow over the antenna radome.

19. An antenna radome comprising:

at least a first face, wherein the at least a first face comprises a plurality of surface features, wherein the plurality of surface features comprise:

at least a first ridge; and at least a first depression, wherein the plurality of surface features are oriented transverse along the antenna radome, wherein the at least a first ridge comprises a plurality of ridges, wherein the at least a first face comprises a windward face of the antenna radome, wherein the windward face of the antenna radome comprises a pair of transverse edges, wherein the at least a first ridge comprises a first ridge and a second ridge, wherein the at least a first depression comprises a first depression and a second depression, wherein the first ridge and the first depression are applied at a first one of the pair of transverse edges, and wherein the second ridge and the second depression are applied at a second one of the pair of transverse edges.

20. The antenna radome of claim 19, wherein the first ridge and the first depression that are applied at a first one of the pair of transverse edges have a taper with a length and an angle relative to a second face of the antenna radome which is adjacent the windward face, and wherein the second ridge and the second depression that are applied at a second one of the pair of transverse edges have a taper with a length and an angle relative to a third face of the antenna radome which is adjacent the windward face.

21. The antenna radome of claim 20, wherein the length and the angle of the taper of the first ridge and the first depression that are applied at the first one of the pair of transverse edges and the length and the angle of the taper of the second ridge and the second depression that are applied at the second one of the pair of transverse edges are design parameters for minimizing a wind load of the antenna radome over a range of wind speeds.

22. The antenna radome of claim 19, where the positions of the first ridge and the second ridge relative to the first transverse edge and the second transverse edge of the windward face of the antenna radome accelerate a wind flow over the antenna radome.

* * * * *